(12) United States Patent
Ritter et al.

(10) Patent No.: US 9,667,031 B2
(45) Date of Patent: May 30, 2017

(54) CURRENT DRIVER FOR DIODE LASER SYSTEM

(71) Applicant: Coherent, Inc., Santa Clara, CA (US)

(72) Inventors: Ulrich Ritter, Mountain View, CA (US); Jerry Chang, Cupertino, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 14/950,867

(22) Filed: Nov. 24, 2015

(65) Prior Publication Data

US 2016/0149376 A1 May 26, 2016

Related U.S. Application Data

(60) Provisional application No. 62/083,787, filed on Nov. 24, 2014.

(51) Int. Cl.
*H01S 5/042* (2006.01)
*H02M 3/156* (2006.01)
*H05B 33/08* (2006.01)
*H01S 5/068* (2006.01)

(52) U.S. Cl.
CPC ............ *H01S 5/042* (2013.01); *H01S 5/0428* (2013.01); *H02M 3/156* (2013.01); *H05B 33/0815* (2013.01); *H01S 5/06808* (2013.01); *H01S 5/06812* (2013.01)

(58) Field of Classification Search
CPC . H01S 5/042; H01S 5/06832; H05B 33/0815; H02M 3/156
See application file for complete search history.

(56) References Cited

U.S. PATENT DOCUMENTS

| 8,125,159 | B2 | 2/2012 | Aiello |
| 8,143,810 | B2 | 3/2012 | Ferro |
| 8,519,634 | B2 | 8/2013 | Lyons |
| 8,760,080 | B2 | 6/2014 | Yu |
| 8,803,445 | B2 | 8/2014 | Pflaum |
| 2003/0218433 | A1 | 11/2003 | Watanabe |
| 2008/0290819 | A1 | 11/2008 | Hoepfner et al. |
| 2009/0016392 | A1* | 1/2009 | Wong ............. H01S 5/06832 372/38.02 |
| 2009/0149150 | A1 | 6/2009 | Buer et al. |
| 2010/0253245 | A1 | 10/2010 | Du et al. |
| 2011/0085576 | A1 | 4/2011 | Crawford et al. |
| 2013/0328504 | A1 | 12/2013 | Yavor |
| 2015/0311739 | A1* | 10/2015 | Schillinger ......... B60L 11/1814 320/107 |

FOREIGN PATENT DOCUMENTS

JP 2003-264337 A 9/2003

OTHER PUBLICATIONS

International Search Report and Written Opinion received for PCT Patent Application No. PCT/US2015/062417, mailed on Jan. 15, 2016, 15 pages.

* cited by examiner

*Primary Examiner* — Dung Nguyen
(74) *Attorney, Agent, or Firm* — Morrison & Foerster LLP

(57) ABSTRACT

An architecture for current driver circuitry for diode laser systems is contemplated whereby the circuitry is both modular and minimally complex with respect to the number of components and connections.

20 Claims, 8 Drawing Sheets

CURRENT DRIVER FOR DIODE LASER SYSTEM

CROSS-REFERENCE TO RELATED APPLICATION

This application claims priority to U.S. Prov. Pat. App. Ser. No. 62/083,787, filed 24 Nov. 2014 and entitled EFFICIENT HIGH SPEED HIGH POWER CURRENT DRIVER FOR DIODES, the entirety of which is hereby incorporated by reference for all intents and purposes.

BACKGROUND

Suppliers of laser solution products for commercial and scientific applications typically encounter a number of obstacles in the effort to bring a particular product to market. For example, the investment required to develop new implementation-specific circuitry may in many instances be prohibitively expensive. To address such and other issues, embodiments of an architecture for current driver circuitry for diode laser systems are contemplated whereby the circuitry is both modular and minimally complex with respect to the number of components and connections. By extension, the circuitry may be less prone to failure, and a significant savings may be realized both in terms of system development and maintenance.

SUMMARY

Embodiments of an architecture for current driver circuitry for diode laser systems are shown and described whereby the circuitry is both modular and minimally complex with respect to the number of components and connections. The circuitry is modular because the same circuitry may be used to drive many different diode loads with as little as changing the magnitude of voltage bias to shift the operating point of the circuitry. The architecture of the circuitry does not need to change. For example, some or all components of the circuitry may exhibit a compliance voltage of 60V or less, which is advantageous because high-voltage PCB board certification or verification is not required, and the circuitry may regulate at or more than 200 A through a diode load and be fast-modulating (e.g., 0-100 kHz, 0-100% duty cycle). A DC offset voltage may be leveraged to compensate for the turn-on or knee voltage of the diode load, and as such the circuitry may drive additional diodes in series with the diode load at 100V, for example, at the same current level even with a change in diode load and according to specification. This is despite the 100V voltage level being greater than the 60V compliance voltage of the circuitry. Additionally, a power scaling aspect may be realized by connecting in parallel identical modules of the current driver circuitry. Further, the circuitry may be minimally complex with respect to the number of components and connections because a particular component of the circuitry may be realized with a single on-board PCB circuit component or element. The power supply that provides the DC offset voltage may not be an on-board circuit component or element. The same is true of the diode load. It is contemplated that the circuitry may be realized in other ways, whereby other circuitry may be built into the current driver circuitry. While additional development and component costs would be incurred and additional failure mechanisms may manifest, in some circumstances, such alternatives may be beneficial.

DETAILED DESCRIPTION

Embodiments of an architecture for current driver circuitry for diode laser systems is shown and described whereby the circuitry is both modular and minimally complex with respect to the number of components and connections. By extension, the circuitry may be less prone to failure, and a significant savings may be realized both in terms of system development and maintenance. Although not so limited, an appreciation of the various aspects of the present disclosure may be gained from the following discussion in connection with the drawings.

Figure 1:
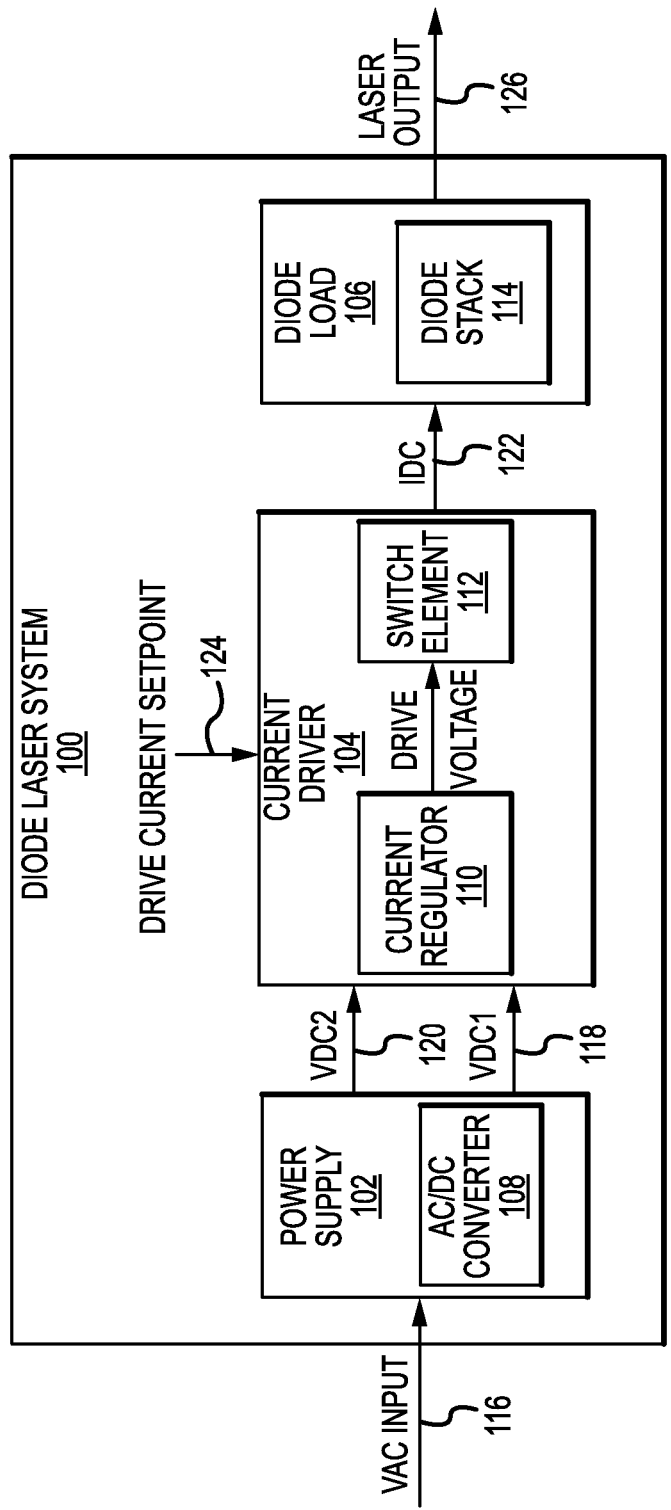
FIG. 1 is a block diagram of a diode laser system according to the disclosure.

For example, FIG. 1 shows a block diagram of an embodiment of a diode laser system 100, equivalently, laser diode system 100, according to the disclosure. In general, the diode laser system 100 is a kilowatt-class laser system for materials processing and industrial applications (e.g., for optical pumping of solid state lasers). One of skill in the art will however appreciate that the diode laser system 100 as described below may be leveraged for other applications, such as low-power LED-driver applications for example. Additionally, one of skill in the art will appreciate that the diode laser system 100 as described below may include a number of elements or components other than that shown. For brevity, however, a discussion directed to such elements or components is omitted.

The diode laser system 100 includes a power supply 102, a current driver 104, and a laser diode load 106. In some embodiments, the current driver 104 alone is built on a low-voltage rated circuit board and thus no component of the current driver 104 has a compliance voltage of greater than 60V. This is advantageous because such a circuit board would not be subject to high-voltage certification or verification. The power supply 102 includes an AC/DC converter 108, the current driver 104 includes a current regulator 110 and a switch element 112, and the diode load 106 includes a diode stack 114. The diode stack 114 includes a string of laser diodes, such as two series-connected stacks of twelve series-connected laser diodes each for example. In this example, the diode stack 114 has a turn-on voltage of about 45.6V assuming that each one of the twenty-four series-connected laser diodes has a turn-on voltage of about 1.9V. These values are used for example purposes only. Other examples are possible.

In operation, the AC/DC converter 108 generates from an AC input voltage 116 (alternatively, a DC input voltage may be leveraged) a first DC supply voltage (VDC1) 118 and a second DC supply voltage (VDC2) 120 to power the current driver 104. The current driver 104 in turn generates a drive current (IDC) 122 to drive the diode load 106. A value or magnitude of the drive current 122 is programmable and is defined by, or is a function of, a drive current setpoint 124. A laser output 126 is formed by combining optical emissions from each one of the plurality of series-connected laser diodes of the diode stack 114.

The first DC supply voltage 118 also biases the switch element 112 and the operating point of the current regulator 110 to enable the current driver 104 to drive the diode stack 114, even though the turn-on or knee voltage of the diode stack 114 (e.g., VK=45.6V) is greater than the compliance voltage of the current regulator 110 (e.g., VC=41.5V). The compliance voltage of the current regulator 110 is the maximum voltage the current regulator 110 will output in attempt to source a programmed current (e.g., drive current 122) under normal operating conditions. Similarly, the compliance voltage range of the current regulator 110 is the range of voltage values the current regulator 110 will output in attempt to source a programmed current (e.g., drive current 122) under normal operating conditions. In other words, within its (compliance voltage range) limits the current regulator 110 can maintain a constant (programmed) current output.

The magnitude of the compliance voltage range of the current regulator 110 is defined by the compliance voltage of the current regulator 110. For example, when the compliance voltage of the current regulator 110 is 60V, the drive voltage level may range from 0V-60V (inclusive), or from 60V-120V (inclusive), or from 120V-180V (inclusive), while the current regulator 110 remains within its compliance voltage range of 0V-60V. A first and second example modular and minimally complex realization of the diode laser system 100, and particularly the current driver 104 of the diode laser system 100, is shown and described in connection with FIG. 2 and FIG. 3.

Figure 2:
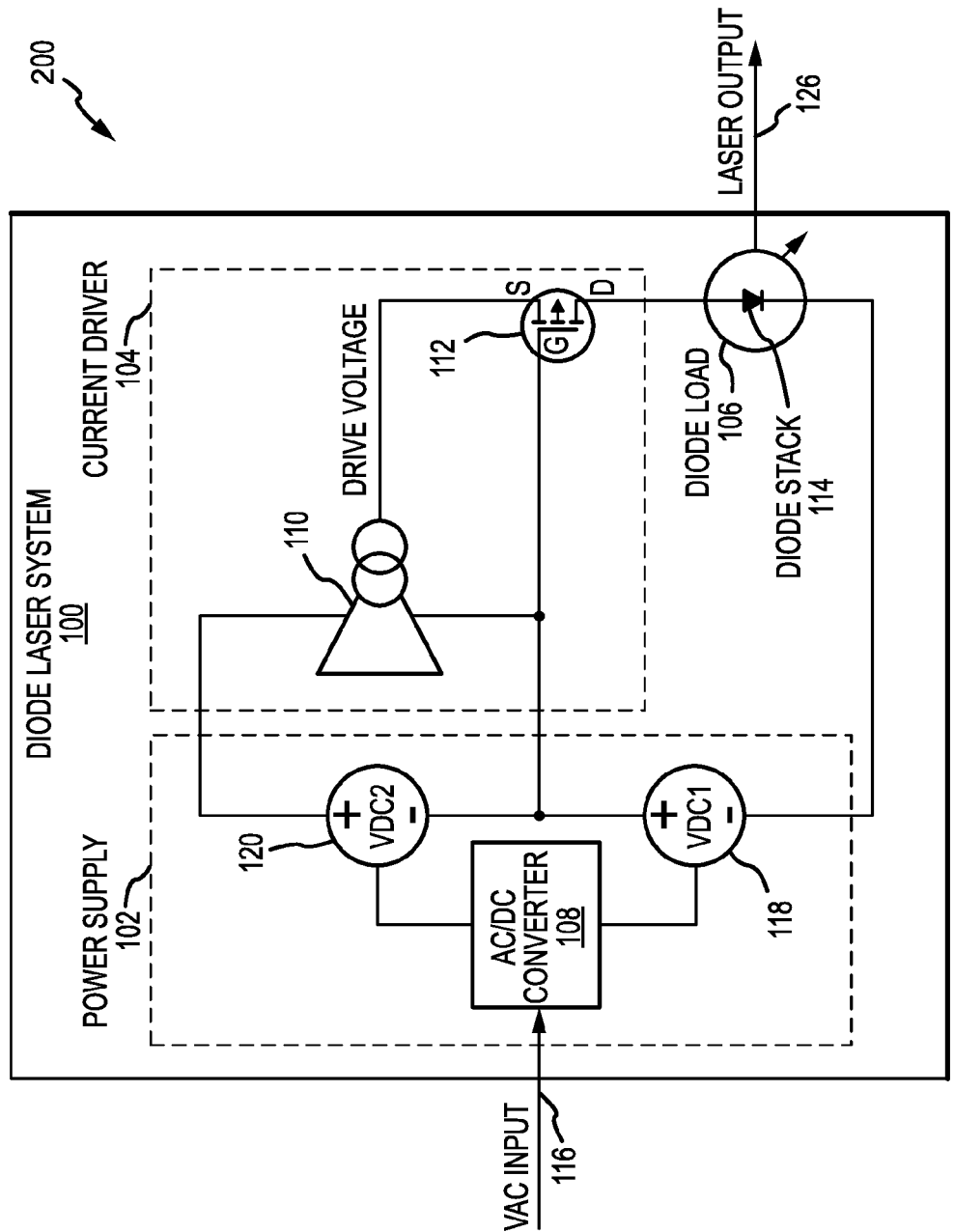
FIG. 2 is a first circuit diagram of the system shown in FIG. 1.
Figure 3:
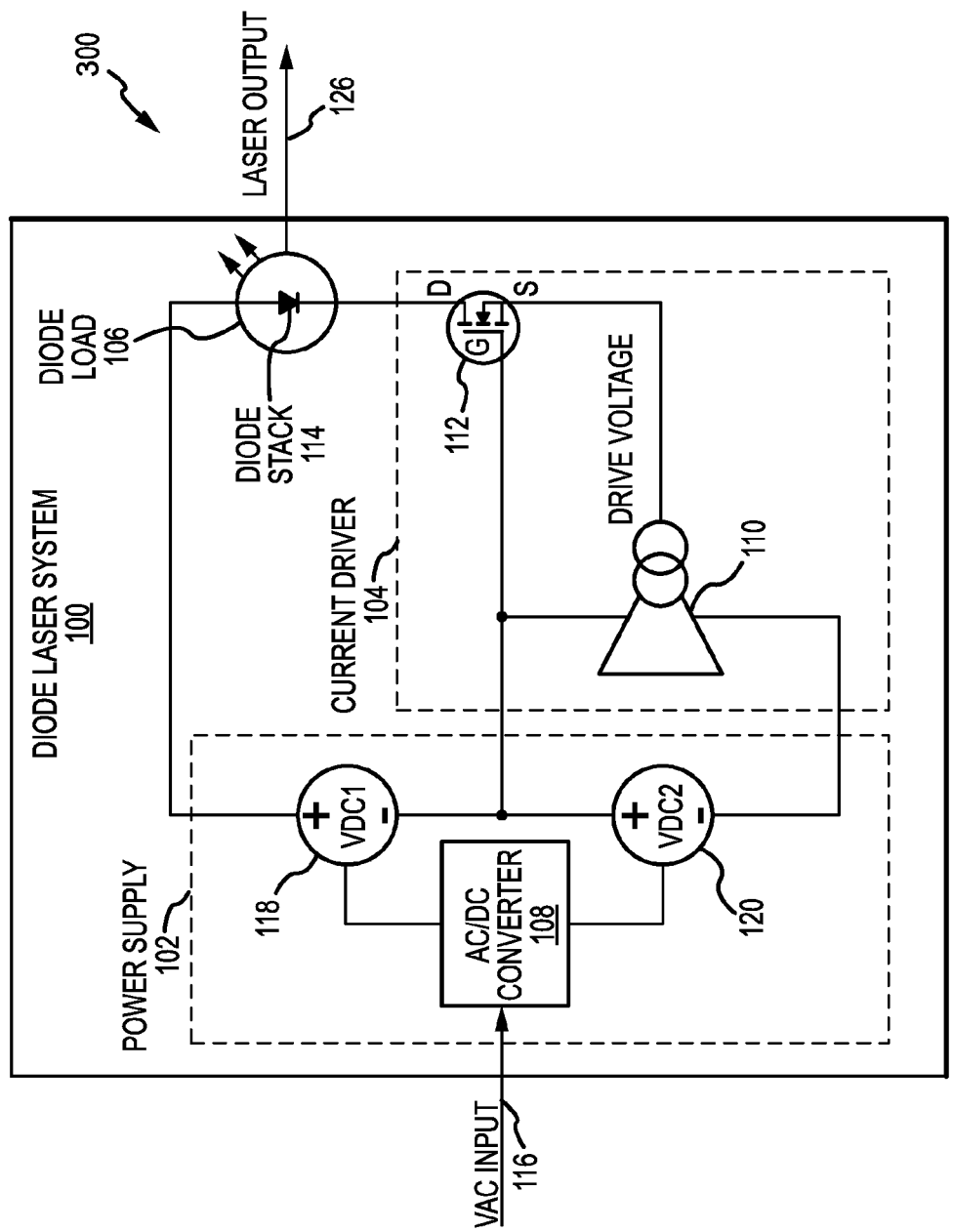
FIG. 3 is a second circuit diagram of the system shown in FIG. 1.

FIG. 2 shows a first circuit diagram 200 of the diode laser system 100 of FIG. 1. FIG. 3 shows a second circuit diagram 300 of the diode laser system 100 of FIG. 1. As shown in FIG. 2, the switch element 112 of the current driver 104 is realized as a high-power, high-gain PMOS transistor. As shown in FIG. 3, the switch element 112 of the current driver 104 is realized as a high-power, high-gain NMOS transistor. It is contemplated that an NMOS transistor may be incorporated into the architecture of the first circuit diagram 200, instead of the PMOS transistor. In such an embodiment, however, additional circuitry would be built around the NMOS transistor (e.g., to measure drive current, enable/disable the transistor, etc.), and thus the architecture of the first circuit diagram 200 would be more complex than that as shown in both FIG. 2 and FIG. 3.

Additionally, one of skill in the art will appreciate that the architecture of the first circuit diagram 200 is an inverted version of the architecture of the second circuit diagram 300, and vice versa. Thus, even though the features or aspects of the present disclosure are discussed herein with reference to the first circuit diagram 200 of FIG. 2, the same or similar principle of operation of the circuit illustrated by the first circuit diagram 200 is applicable to the circuit illustrated by second circuit diagram 300 of FIG. 3. In practice, however, the current driver 104 of the first circuit diagram 200 is in general a current source, whereas the current driver 104 of the second circuit diagram 300 is in general a current sink.

With reference to FIG. 2, the AC/DC converter 108 generates VDC1 and VDC2 from the AC input voltage 116. Each one of VDC1 and VDC2 has a fixed, regulated DC voltage, such as VDC1=VDC2=41.5V for example. Other examples are however possible. For instance, it may be advantageous to leverage one or more commodity power supplies that exhibit a supply voltage of 24V, 48V, 54V, and etc., since such power supplies are relatively inexpensive and in general are widely used and available. Additionally, while two batteries or supply voltages are shown in FIG. 2, other configurations or arrangements are possible. For example, three or more batteries or supply voltages may be leveraged, such as three batteries or supply voltages each of 48V, whereby VDC1=96V and VDC2=VDC1+48V=144V. Such a configuration may be advantageous when, for example, the diode stack 114 includes three series-connected diode stacks in which each diode stack has a turn-on voltage of 40V so that the turn-on voltage of the diode stack 114 is 120V. In this and other similar examples, the current driver 104, and more specifically the current regulator 110, may drive the diode stack 114 even though the compliance voltage of the current regulator 110 is less than the turn-on voltage of the diode stack 114.

For example, and as shown in FIG. 2, VDC1 and VDC2 are connected in series whereby VDC1 and (VDC1+VDC2) are provided as the bottom power rail and the top power rail of the current regulator 110, respectively. Voltage levels VDC1 and (VDC1+VDC2) are with respect to the common node shared by the cathodes of the DC supply 118 and the diode stack 114. Advantageously, such a configuration effectively biases or shifts the operating point of the current regulator 110 to enable the current regulator 110 to fully drive the diode stack 114, even though the turn-on voltage of the diode stack 114 (e.g., VK=45.6V) is greater than the compliance voltage of the current regulator 110 (e.g., VC=41.5V). This is further illustrated in FIG. 4.

Figure 4:
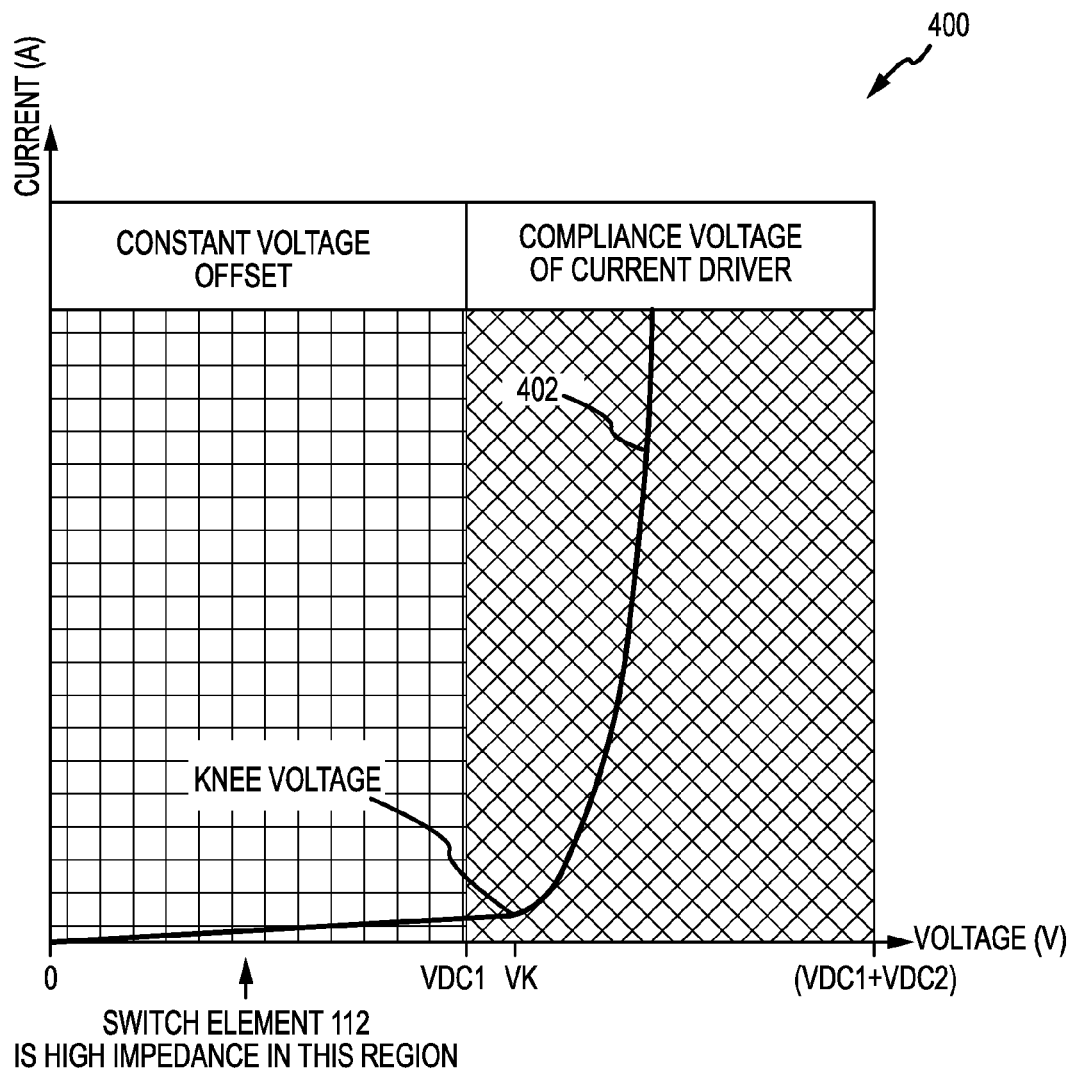
FIG. 4 is a chart diagram of a first I-V characteristic according to the disclosure.

FIG. 4 shows a chart diagram 400 of certain voltage mappings of the diode laser system 100 of the present disclosure. In particular, a diode characteristic 402 as shown in FIG. 4 corresponds to the I-V characteristic of the diode stack 114, whereby the voltage VK corresponds to the turn-on voltage of the diode stack 114 (e.g., VK=45.6V). The turn-on voltage of the diode stack 114, along with the voltage range that corresponds to the entire high-current part of the diode characteristic 402, falls within a voltage range that corresponds to a normal operating range of the current regulator 110. This is because, as mentioned above, (VDC1+VDC2) corresponds to the top power rail of the current regulator 110 (e.g., VDC1+VDC2=41.5V+41.5V=83V), and VDC1 corresponds to the bottom power rail of the current regulator 110 (e.g., VDC1=41.5V). One of skill in the art will appreciate that, since the current regulator 110 is operating closed-loop, the maximum and minimum drive voltages output by the current regulator 110 during normal operation correspond to the top power rail and the bottom power rail of the current regulator 110, respectively. In this manner, the supply voltage configuration as shown in FIG. 2 (and FIG. 3) effectively biases or shifts the operating point of the current regulator 110 to enable the current regulator 110 to fully drive the diode stack 114, even though the turn-on voltage of the diode stack 114 is greater than the compliance voltage of the current regulator 110.

When connected as shown in FIG. 2 (or FIG. 3), the PMOS transistor 112 (or NMOS transistor 112 of FIG. 3) is an active component that monitors or detects the drive voltage that is output by the current regulator 110 and responds accordingly. More specifically, the PMOS transistor 112 as connected as shown in FIG. 2 is self-regulating and thus may be considered a sensor that changes its state in response to particular stimulus. For example, when the drive voltage level of the current regulator 110 exceeds the knee or turn-on voltage of the diode stack 114, VSG is positive. The PMOS transistor 112 is "on" because the gate node of the PMOS transistor 112 is tied to VDC1 (e.g., VSG>VK−VDC1=45.6V-41.5V=4.1V) and VSG exceeds the gate threshold voltage (VSGT) of the PMOS transistor 112, which is typically in the range 2V-4V. Additionally, in this scenario, VSD is essentially zero because the PMOS transistor 112 is in a conducting state. The voltage level at the source node of the PMOS transistor 112 is nearly entirely dropped across the diode stack 114 as the sum of the voltage drop across the diode stack 114 and the source/drain nodes of the PMOS transistor 112 is about equal to the voltage at the source node of the PMOS transistor 112 (e.g., VSD=VS−Vdiode~45.6V−45.6V~0V). In this manner, the PMOS transistor 112 is a low impedance or highly conducting component when the drive voltage level exceeds the knee voltage of the diode stack 114.

In contrast, the PMOS transistor 112 transitions to a high impedance or low conductivity component when the difference between the drive voltage level of the current regulator 110 and VDC1 is reduced to less than the gate threshold voltage (VGST) of the PMOS transistor 112. More specifically, when the difference between the drive voltage level of the current regulator 110 and the gate voltage (VSG) is below the gate threshold voltage and decreasing, the PMOS transistor 112 changes from the low impedance "on" state to a closed-loop loop regulated state. This is the case when the current regulator 110 is adjusting to a low current setting and performs or implements the adjustment by reducing its output voltage.

The current regulator 110, the PMOS transistor 112 and the diode stack 114 are in series electrically and conduct the same amount of current. A "low" current sourced by the current regulator 110 reduces the voltage over the diode stack 114, even below the knee voltage of the diode stack 114. Below the gate threshold voltage, the impedance of the PMOS transistor 112 increases and therefore VSD increases and is additive to the voltage dropped over the diode stack 114. This acts as closed-loop feedback. To reduce the current, the current regulator 110 drops its output voltage; this reduces VSG which results in an increase in VSD. This again reduces the voltage drop over the diode stack 114. An end case would be a 0 A request, which reduces the output voltage of the current regulator 110 to VDC1 and VSG to 0 V. In this case, the impedance between the source and drain will be high and VSD voltage will be approximately VDC1. At this point there will be no or near zero current through the diode stack 114, and little to no voltage drop will occur over the diode stack 114. In this manner, the PMOS transistor 112 transitions to a high impedance component when the difference between the drive voltage level of the current regulator 110 and VDC1 is reduced to less than the gate threshold voltage of the PMOS transistor 112. The self-regulating nature of the PMOS transistor 112 as connected as shown in FIG. 2 is further demonstrated in FIG. 5.

Figure 5:
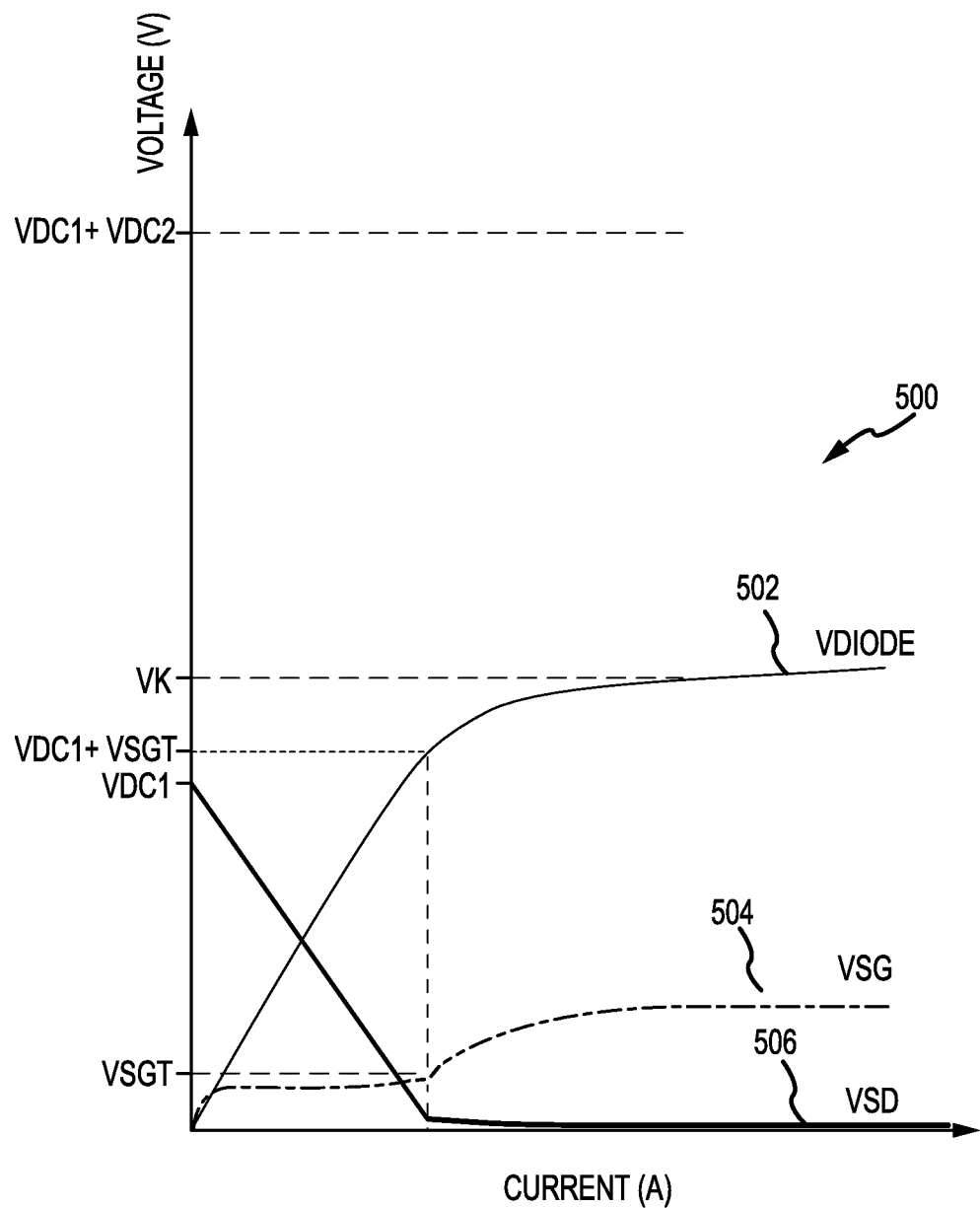
FIG. 5 is a chart diagram of a second I-V characteristic according to the disclosure.

FIG. 5 shows a chart diagram 500 of certain node voltages of the diode laser system 100 of FIG. 2. In particular, a first characteristic 502 as shown in FIG. 5 describes the voltage characteristic of the diode stack 114 as a function of drive current provided by the current regulator 110. This characteristic is similar to the diode characteristic 402 discussed above in connection with FIG. 4. A second characteristic 504 as shown in FIG. 5 describes the voltage characteristic of VSG of the PMOS transistor 112 as a function of drive current provided by the current regulator 110. VSG is initially zero and then increases to VSGT as the drive voltage level of the current regulator 110 approaches VDC1+VGST. A third characteristic 506 as shown in FIG. 5 describes the voltage characteristic of VSD of the PMOS transistor 112 as a function of drive current provided by the current regulator 110. VSD is initially at VDC1 and then is essentially zero when the drive voltage level of the current regulator 110 exceeds VDC1+VGST. The slope in VSD at and beyond this threshold is essentially zero due to the high gain of the PMOS transistor 112.

To a good approximation, the PMOS transistor 112 is a perfect or ideal MOSFET, meaning there is no current flow between either one of the gate/source nodes and the gate/drain nodes of the PMOS transistor 112 under normal operating conditions. Therefore, drive current output by the current regulator 110 is equal to the current that flows through the PMOS transistor 112 and the diode stack 114.

When VSG>VSGT, the PMOS transistor 112 exhibits a low impedance and is highly conductive. In this scenario, the PMOS transistor 112 does not contribute to the electrical load. The electrical load is essentially the diode stack 114, and the current regulator 110 regulates the drive current as intended.

According to the principles of the present disclosure, VK>(VDC1+VSGT). In this condition, when either increasing or decreasing drive current, the current regulator 110 regulates the current through the diode stack 114, as intended. Also, when the drive voltage level is below VDC1+VSGT, there is impedance between the source/drain nodes of the PMOS transistor 112 and thus any current would heat the PMOS transistor 112. Therefore, to ensure high-current operation occurs when the PMOS transistor 112 exhibits a low impedance, VDC1 is selected to be less than (VK−VSGT).

Consider the case when the diode laser system 100 transitions from high optical output to no or zero optical output. First, the drive current setpoint 124 is reduced. The current regulator 110 responds by lowering the drive voltage and thereby the drive current. The drive voltage level will transition through VK and continue decreasing. When the drive voltage level transitions below VDC1+VSGT, the impedance between the source/drain nodes of the PMOS transistor 112 starts to increase (see FIG. 5) and the PMOS transistor 112 starts to contribute to the electrical load. As the current regulator 110 continues to reduce the drive voltage, the voltage between the source/gate nodes of the PMOS transistor 112 tends towards zero and the impedance between the source/drain nodes of the PMOS transistor 112 increases. Further, the voltage between the source/drain nodes of the PMOS transistor 112 tends towards VDC1 and therefore the voltage drop across the diode stack 114 tends towards zero. This is illustrated in FIG. 5. Throughout, the relationship (VDC1+VSG)=(VDiode+VSD) holds true.

The arrangement shown in FIG. 2 (and FIG. 3) enables the current regulator 110 to regulate current over the entire range between zero and the rated current maximum for the diode stack 114. In the low current condition, diode load changes dramatically with changing current, but is compensated by the changing load of the PMOS transistor 112. The current regulator 110 adjusts the relatively small voltage across VSG and the PMOS transistor 112 matches this with a larger voltage adjustment across VSD. In other words, the current regulator 110 regulates drive current by adjusting its output voltage along the VSG curve of FIG. 5. In adjusting the output voltage between VDC1 and VDC1+VDC2, the voltage drop across the diode stack 114 is changed between 0V and VDC1+VK. The output voltage of the current regulator 110 tracks along the VSG curve, adjusting voltage to achieve and maintain the set drive current. In adjusting the output voltage of the current regulator 110 above VDC1+ VSGT, the voltage drop across the diode stack 114 changes identically, volt-for-volt.

Figure 6:
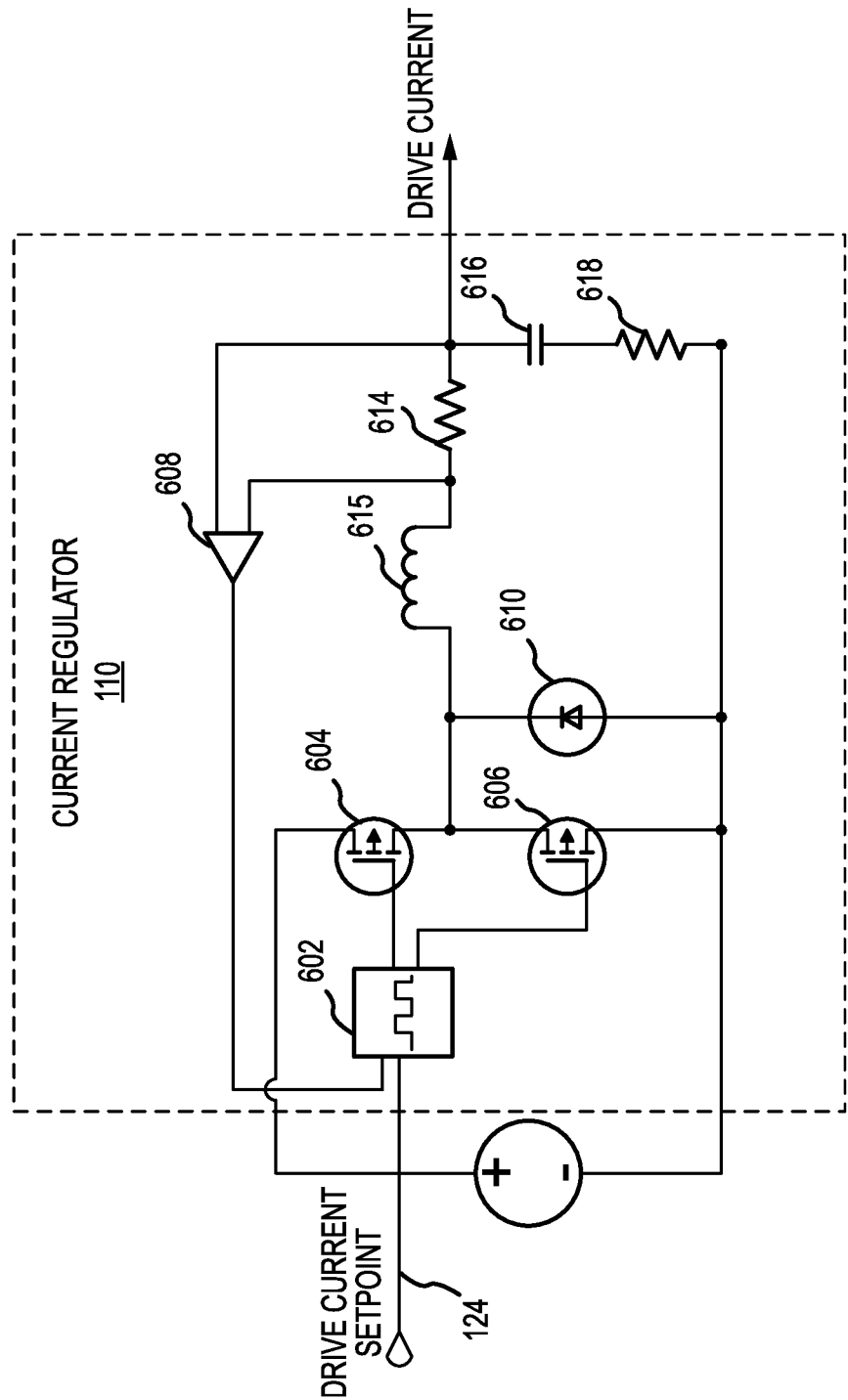
FIG. 6 is a circuit diagram of a current regulator according to the disclosure.

FIG. 6 is a circuit diagram of an example embodiment of the current regulator 110 of the diode laser system 100 of FIG. 2. In general, the current regulator 110 is a synchronous switching converter that comprises a controller 602, a high-side switch 604, a low-side switch 606, a current feedback component 608, a diode 610, an output inductor 612, a shunt resistor 614, and an output capacitor 616. Since the current regulator 110 is incorporated into a high-power system or application (i.e., diode laser system 100), as opposed to a low-power system or application in which the synchronous converter topology is typically leveraged, a fast transient current may occur when the drive current setpoint 124 is changed or when the diode laser system 100 is enabled or turned-on. That transient current may lead to significant current overshoot, a transient oscillation, or an instable output current, all of which may be due to parasitic output wire inductance and other parasitic effects that together with the inductance and capacitance presented by the output inductor 612 and output capacitor 616, respectively, create a parasitic oscillator circuit.

Figure 7:
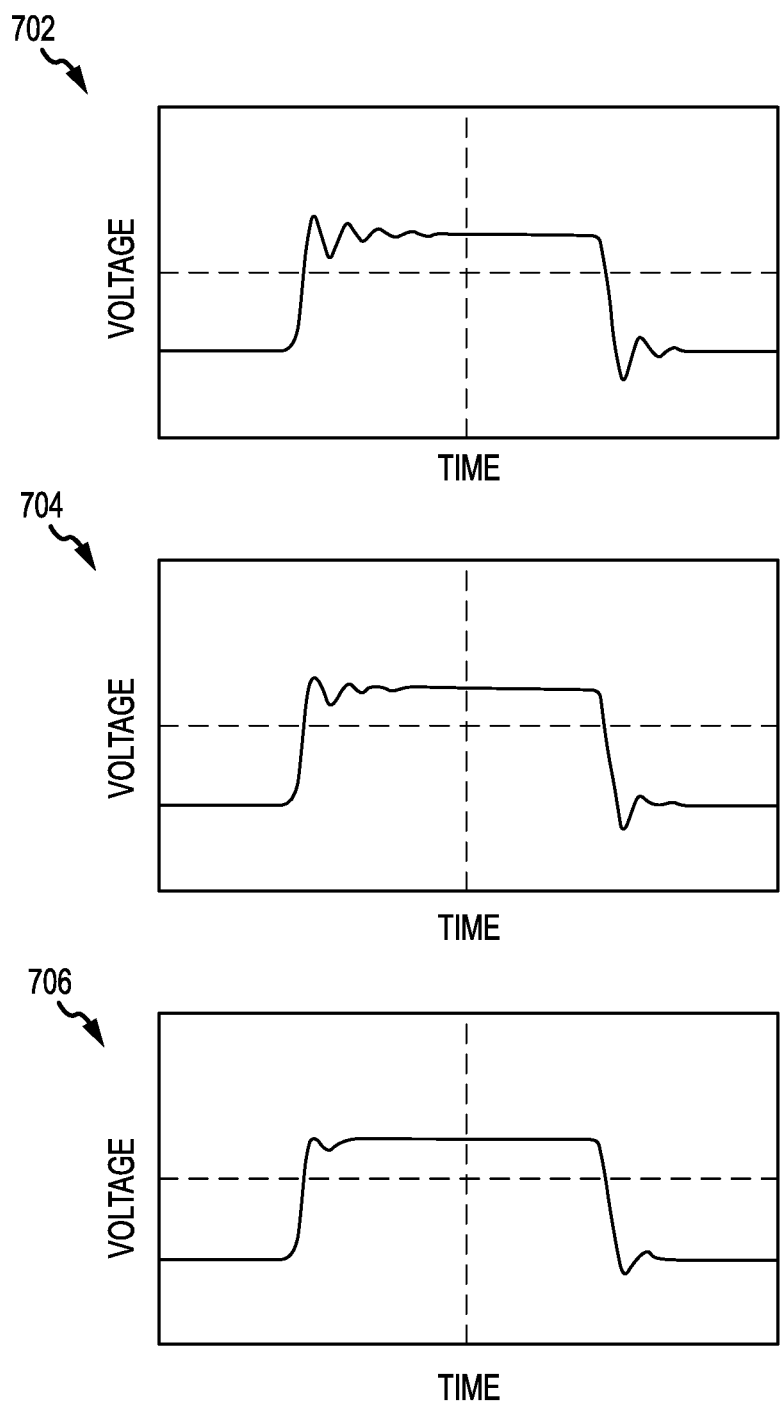
FIG. 7 is a chart diagram of switching responses of the regulator shown in FIG. 6.

To compensate, a damping resistor 618 is connected in series with the output capacitor 616, and one of skill will appreciate that the damping resistor 618 may be utilized in a similar manner with respect to the current regulator 110 of the diode laser system 100 of FIG. 3. In general, such a modification is contrary to conventional wisdom since the introduction of an additional resistance as contemplated may lead to among other things additional power dissipation and heat generation due to the high-power nature of the diode laser system 100. However, the diode laser system 100 is powered via mains supply (see FIG. 1), and further the electronics of the diode laser system 100 is in general water-cooled. In this manner, the cost of the trade-off between performance and additional power dissipation and heat generation is minimized. FIG. 7 is a chart diagram of switching responses of the current regulator 110 as a function of damping resistance.

In particular, a first characteristic 702 provided in FIG. 7 shows a pronounced ringing in the switching response of the current regulator 110. The value of the damping resistor 618 used in the bench test to generate the first characteristic 702 is 0 (zero) ohms. Thus, the first characteristic 702 captures the response of the current regulator 110 with the damping resistor 618 omitted from the circuit. In contrast, a second characteristic 704 provided in FIG. 7 shows a less-pronounced ringing in the switching response of the current regulator 110. The value of the damping resistor 618 used in the bench test to generate the second characteristic 704 is 15 milliohms, all other variables being held equal. Additionally, a third characteristic 706 provided in FIG. 7 shows an even less-pronounced ringing in the switching response of the current regulator 110. The value of the damping resistor 618 used in the bench test to generate the third characteristic 706 is 100 milliohms, all other variables being held equal. Thus, both the second characteristic 704 and the third characteristic 706 capture the response of the current regulator 110 with the damping resistor 618 included in the circuit, whereby the magnitude of ringing in the switching response is inversely proportional to the value of the damping resistor 618.

Figure 8:
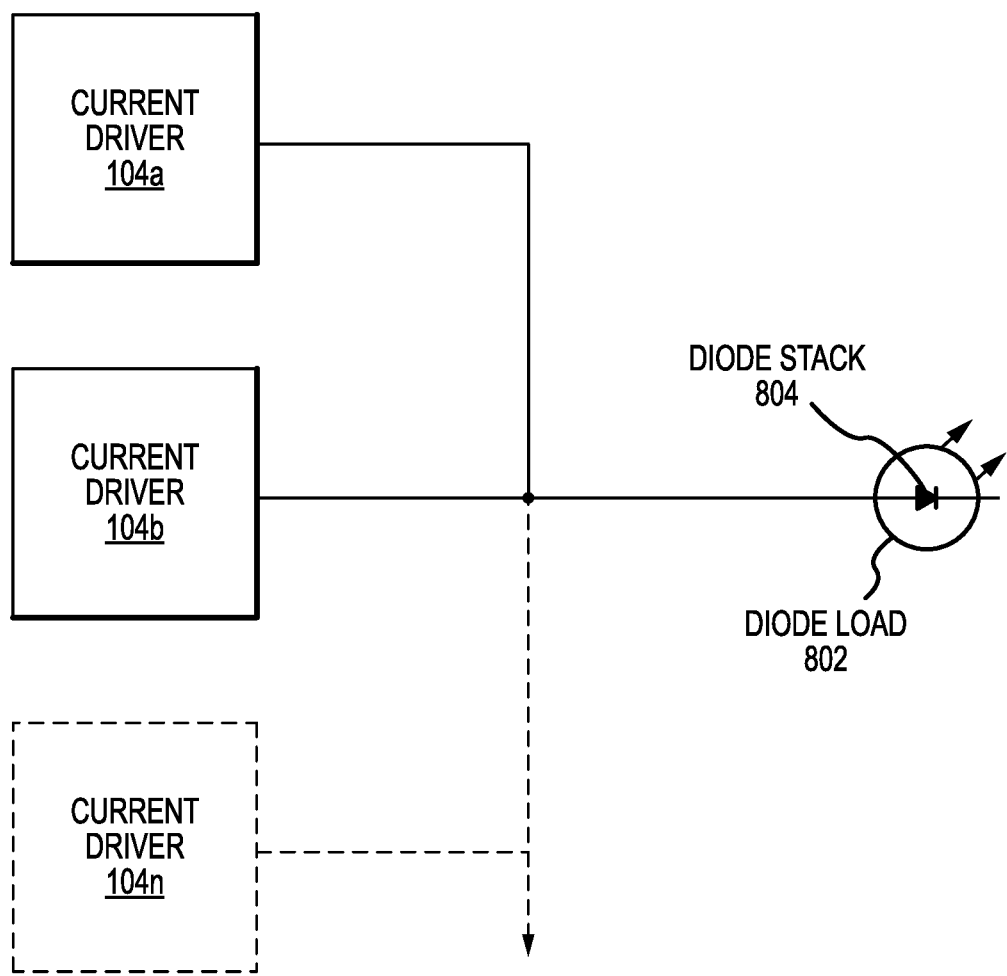
FIG. 8 is a block diagram of a power scaling aspect according to the disclosure.

FIG. 8 is a block diagram of a power scaling aspect according to the disclosure. More specifically, an unspecified integer number of modules of the current driver 104a-n of the present disclosure are shown connected together in parallel to drive a diode load 802 that comprises a diode stack 804. The diode stack 114 comprises an unspecified integer number of series-connected laser diodes. In this manner, multiple instances of the current driver 104 may be coupled together in order to drive any particular diode load. Additionally, or alternatively, one or both of VDC1 and VDC2 may be tuned independently of each other in order to shift the operating point of a single instance of the current driver 104 on an application- or implementation-specific basis. In some instances, a non-complex clamp circuit may be built around the PMOS transistor 112 to ensure that VSG does not exceed an allowable or permissible value that is a function of the type and rating of the PMOS transistor 112.

As shown in the figures and described above, the architecture of the current driver 104 as contemplated is both modular and minimally complex with respect to the number of components and connections. The current driver 104 is modular because the same may be used to drive many different diode loads with as little as changing the magnitude of voltage bias to shift the operating point of the current driver 104. The architecture of the current driver 104 does not need to change. For example, some or all components of the current driver 104 may exhibit a compliance voltage of 60V or less, which is advantageous because high-voltage PCB board certification or verification is not required, and the current driver 104 may regulate at or more than 200 A through a diode load and be fast-modulating (e.g., 0-100 kHz, 0-100% duty cycle). A DC offset voltage may be leveraged to compensate for the turn-on or knee voltage of the diode load, and as such the current driver 104 may drive additional diodes in series with the diode load at 100V, for example, at the same current level even with a change in diode load and according to specification. This is despite the 100V voltage level being greater than the 60V compliance voltage of the current driver 104. Additionally, a power scaling aspect may be realized by connecting in parallel identical modules of the current driver 104. Further, the current driver 104 may be minimally complex with respect to the number of components and connections because a particular component of the current driver 104, the switch element 112, may be realized with only a single on-board (i.e., PCB) circuit component or element, namely a PMOS or NMOS transistor. The power supply that provides the DC offset voltage may not be an on-board circuit component or element. The same is true of the diode load. It is contemplated that the current driver 104 may be realized in other ways, whereby other circuitry may be built into the current driver 104. While additional development and component costs would be incurred and additional failure mechanisms may manifest, in some circumstances, such alternatives may be beneficial.

In light of such and other benefits and advantages, a current driver for a diode laser system is contemplated whereby the current driver includes or comprises a current regulator and a switch element. The current regulator and the switch element may be configured and/or arranged similar to the current regulator 110 and the switch element 112, respectively, as shown and described above in connection with at least FIG. 2 and FIG. 3. In particular, the current regulator may be configured to receive from a power supply a bias voltage, where the bias voltage shifts a compliance voltage range of the current regulator to include a knee voltage of a diode load, and where the bias voltage has a value that corresponds to a lower bound of the shifted compliance voltage range. An example of such a shifted compliance voltage range is illustrated and described above in connection with FIG. 4. Additionally, the switch element may be coupled to the current regulator and to the diode load. The switch element may be configured to detect a voltage that is output by the current regulator to supply drive current to the diode load, where the switch element has (a) a high impedance when the voltage that is output by the current regulator to supply drive current to the diode load has a level that is less than the value of the bias voltage and (b) a low impedance when the voltage that is output by the current regulator to supply drive current to the diode load has a level that is greater than a sum of a turn-on threshold voltage of the switch element and the value of the bias voltage. An example of such a variable-impedance switch element is a PMOS transistor, or an NMOS transistor, that when incorporated into a circuit architecture in a manner as shown and described above in connection with FIG. 2 and FIG. 3 exhibits I-V characteristics similar to that shown and described above in connection with FIG. 4 and FIG. 5. Further, one of skill will appreciate that in practice the level of particular voltages as discussed throughout hold meaning when measured or defined with respect to a particular circuit node, such as the gate node of the transistor as shown and described above in connection with FIG. 2 and FIG. 3 for example. Other examples are possible.

In some embodiments, the compliance voltage range (and similarly the shifted compliance voltage range) is 60V or less in magnitude. In general, the compliance voltage range is defined by the compliance voltage of the current regulator. In some embodiments, the current regulator is powered by the difference between a supply voltage that is less than or equal to twice the bias voltage in magnitude and the bias voltage (e.g., bias voltage=48V; supply voltage=96V or bias voltage=96V; supply voltage=144V). In some embodiments, a damping resistor is coupled in series with a capacitor that is coupled to an output node of the current regulator, where the damping resistor has electrical resistance selected from a range of ohmic values between 15 milliohms to 1000 milliohms inclusive. An example of such a feature(s) is shown and described above in connection with FIG. 6 and FIG. 7, where the current regulator is a synchronous buck converter that exhibits a modulation frequency of about 100 kHz or less, or equivalently can be switched on the order of 10 μs. A particular ohmic value or electrical resistance value of the damping resistor may be selected on an implementation-specific basis, so as to tune signal response in the time domain to minimize ringing, exhibit particular rise/fall times, and etc., as desired.

Although only certain exemplary embodiments have been described in detail above, those skilled in the art will readily appreciate that many modifications are possible in the exemplary embodiments without materially departing from the novel teachings and advantages of this disclosure. Aspects of embodiments disclosed above can be combined in other combinations to form additional embodiments. All such modifications are intended to be included within the scope of this technology.

What is claimed is:

1. A current driver for a diode system, comprising
a current regulator that is configured to receive from a power supply a bias voltage, wherein the bias voltage shifts a compliance voltage range of the current regulator to include a knee voltage of a diode load, and wherein the bias voltage has a value that corresponds to a lower bound of the shifted compliance voltage range; and
a switch element that is coupled to the current regulator and to the diode load, the switch element configured to detect a voltage level that is output by the current regulator to supply drive current to the diode load, wherein the switch element has (a) a high impedance when the voltage level that is output by the current regulator to supply drive current to the diode load is less than the value of the bias voltage and (b) a low impedance when the voltage level that is output by the current regulator to supply drive current to the diode load is greater than a sum of a threshold voltage value and the value of the bias voltage.

2. The current driver of claim 1, wherein the compliance voltage range is 60V or less in magnitude.

3. The current driver of claim 1, wherein the switch element is a PMOS transistor, and a source node of the PMOS transistor is coupled to the current regulator, a gate node of the PMOS transistor is biased by the bias voltage, and a drain node of the PMOS transistor provides for drive current a path to the diode load.

4. The current driver of claim 1, wherein the switch element is an NMOS transistor, and a source node of the NMOS transistor is coupled to the current regulator, a gate node of the NMOS transistor is biased by the bias voltage, and a drain node of the NMOS transistor provides for drive current a path to the diode load.

5. The current driver of claim 1, wherein the current regulator is powered by a difference between a supply voltage that is twice the bias voltage in magnitude and the bias voltage.

6. The current driver of claim 1, wherein the current regulator is powered by a difference between a supply voltage that is less than twice the bias voltage in magnitude and the bias voltage.

7. The current driver of claim 1, further comprising a damping resistor that is coupled in series with a capacitor that is coupled to an output node of the current regulator, wherein the damping resistor has an electrical resistance selected from between 15 milliohms to 1000 milliohms inclusive.

8. The current driver of claim 1, wherein the current regulator is a synchronous buck converter.

9. The current driver of claim 1, wherein a modulation frequency of the current regulator is about 100 kHz or less.

10. A diode system, comprising:
a diode load;
a power supply that is configured to output a bias voltage;
a current regulator that is coupled to the power supply and that is configured to receive from the power supply the bias voltage, wherein the bias voltage shifts a compliance voltage range of the current regulator to include a knee voltage of the diode load, and wherein the bias voltage has a value that corresponds to a lower bound of the shifted compliance voltage range; and
a switch element that is coupled to the current regulator and to the diode load, the switch element configured to detect a voltage level that is output by the current regulator to supply drive current to the diode load, wherein the switch element has (a) a high impedance when the voltage level that is output by the current regulator to supply drive current to the diode load is less than the value of the bias voltage and (b) a low impedance when the voltage level that is output by the current regulator to supply drive current to the diode load is greater than a sum of a threshold voltage value and the value of the bias voltage.

11. The diode system of claim 10, wherein the compliance voltage range is 60V or less in magnitude.

12. The diode system of claim 10, wherein the switch element is a PMOS transistor, and a source node of the PMOS transistor is coupled to the current regulator, a gate node of the PMOS transistor is biased by the bias voltage, and a drain node of the PMOS transistor provides for drive current a path to the diode load.

13. The diode system of claim 10, wherein the switch element is an NMOS transistor, and a source node of the NMOS transistor is coupled to the current regulator, a gate node of the NMOS transistor is biased by the bias voltage, and a drain node of the NMOS transistor provides for drive current a path to the diode load.

14. The diode system of claim 10, wherein the current regulator is powered by a difference between a supply voltage that is less than or equal to twice the bias voltage in magnitude and the bias voltage.

15. The diode system of claim 10, wherein the diode load includes a plurality of series-connected diodes.

16. The diode system of claim 10, further comprising a damping resistor that is coupled in series with a capacitor that is coupled to an output node of the current regulator, wherein the damping resistor has an electrical resistance selected from between 15 milliohms to 1000 milliohms inclusive.

17. The diode system of claim 10, wherein the current regulator is a synchronous buck converter.

18. The diode system of claim 10, wherein a modulation frequency of the current regulator is about 100 kHz or less.

19. The diode system of claim 10, wherein the power supply includes a pair of series-connected voltage sources, and wherein a first voltage source of the pair is configured to output the bias voltage and a second voltage source of the pair is configured to output a supply voltage that has a magnitude equal to or different than a magnitude of the bias voltage.

20. A current driver for a diode laser system, comprising
a current regulator that is configured to receive from a power supply a bias voltage, wherein the bias voltage shifts a compliance voltage range of the current regulator to include a knee voltage of a laser diode load, and wherein the bias voltage has a value that corresponds to a lower bound of the shifted compliance voltage range; and
a transistor that is coupled to the current regulator and that is configured to detect a voltage level that is output by the current regulator to supply drive current to the laser diode load, wherein the transistor has (a) a high impedance when the voltage level that is output by the current regulator to supply drive current to the laser diode load is less than the value of the bias voltage and (b) a low impedance when the voltage level that is output by the current regulator to supply drive current to the laser diode load is greater than a sum of a threshold voltage value and the value of the bias voltage;
wherein a source node of the transistor is coupled to the current regulator, a gate node of the transistor is biased by the bias voltage, and a drain node of the transistor provides for drive current a path to the laser diode load.

* * * * *